United States Patent
Swamy

(10) Patent No.: US 10,938,373 B2
(45) Date of Patent: Mar. 2, 2021

(54) INTERDIGITAL TRANSDUCER ARRANGEMENTS FOR SURFACE ACOUSTIC WAVE DEVICES

(71) Applicant: Qorvo US, Inc., Greensboro, NC (US)

(72) Inventor: Manjunath Swamy, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 16/156,014

(22) Filed: Oct. 10, 2018

(65) Prior Publication Data

US 2020/0021267 A1    Jan. 16, 2020

Related U.S. Application Data

(60) Provisional application No. 62/698,509, filed on Jul. 16, 2018.

(51) Int. Cl.
    *H03H 9/02* (2006.01)
    *H03H 9/64* (2006.01)
    *H03H 9/13* (2006.01)
    *H03H 9/72* (2006.01)
    *H03H 9/145* (2006.01)

(52) U.S. Cl.
    CPC ........ *H03H 9/02952* (2013.01); *H03H 9/133* (2013.01); *H03H 9/145* (2013.01); *H03H 9/6489* (2013.01); *H03H 9/725* (2013.01)

(58) Field of Classification Search
    CPC .. H03H 9/02952; H03H 9/133; H03H 9/6489; H03H 9/725; H03H 9/145; H03H 9/14591; H03H 9/6436; H03H 9/02637
    USPC .......................................... 333/133, 193–196
    See application file for complete search history.

(56) References Cited

U.S. PATENT DOCUMENTS

| 8,031,034 B1 | 10/2011 | Solal et al. | |
|---|---|---|---|
| 2012/0326809 A1* | 12/2012 | Tsuda | H03H 9/6483 333/195 |
| 2013/0257562 A1* | 10/2013 | Schmidhammer | H03H 9/64 333/133 |

FOREIGN PATENT DOCUMENTS

WO    WO-2012160730 A1 *   11/2012  ......... H03H 9/14579

OTHER PUBLICATIONS

Machine English Translation of WO2012160730 A1 Published on Nov. 29, 2012 (Year: 2012).*

(Continued)

*Primary Examiner* — Rakesh B Patel
*Assistant Examiner* — Jorge L Salazar, Jr.
(74) *Attorney, Agent, or Firm* — Withrow & Terranova, P.L.L.C.

(57) ABSTRACT

Acoustic wave devices and interdigital transducer (IDT) arrangements for surface acoustic wave (SAW) devices are disclosed. Representative SAW devices are described herein that provide sharp transitions between passband frequencies and frequencies that are outside of desired passbands. A SAW device may include several IDTs arranged between reflective structures on a piezoelectric material and one or more additional IDTs or electrode pairs that are configured to modify the influence of parasitic capacitance, or other internal device capacitance, thereby improving steepness on the upper side of a passband as well as improving rejection for frequencies outside of the passband. The one or more additional IDTs or electrode pairs may be configured as at least one of a capacitor, an IDT capacitor, an IDT with a floating electrode, or combinations thereof.

13 Claims, 10 Drawing Sheets

(56) References Cited

OTHER PUBLICATIONS

Beaudin, Steve, et al., "Shoulder Supressing Technique for Dual Mode Saw Resonators," IEEE Ultrasonics Symposium, 1999, pp. 389-393.
Coon, Allan, "Capabilities and Applications of SAW Coupled-Resonator Filters," AN 23, Dec. 1990, Murata Manufacturing Co., Ltd., 16 pages.
Inoue, Shogo, et al., "Ultra-Steep Cut-Off Double Mode SAW Filter and Its Application to a PCS Duplexer," IEEE Transactions on Ultrasonics, Ferroelectrics, and Frequency Control, vol. 54, Issue 9, Sep. 2007, pp. 1882-1887.
Meltaus, Johanna, et al., "Double-Resonance SAW Filters," IEEE Transactions on Ultrasonics, Ferroelectrics, and Frequency Control, vol. 54, Issue 3, Mar. 2007, 10 pages.
Rusakov, A.N., et al., "Design of Wide Band Saw Coupled Resonator Filters on Quartz," IEEE Symposium on Ultrasonics, Oct. 5-8, 2003, Honolulu, Hawaii, 5 pages.
Wang, Weibiao, "High Selectivity SAW DMS Filter with In-between Shorted-gratings," International Ultrasonics Symposium Proceedings, 2010, IEEE, pp. 1263-1266.

\* cited by examiner

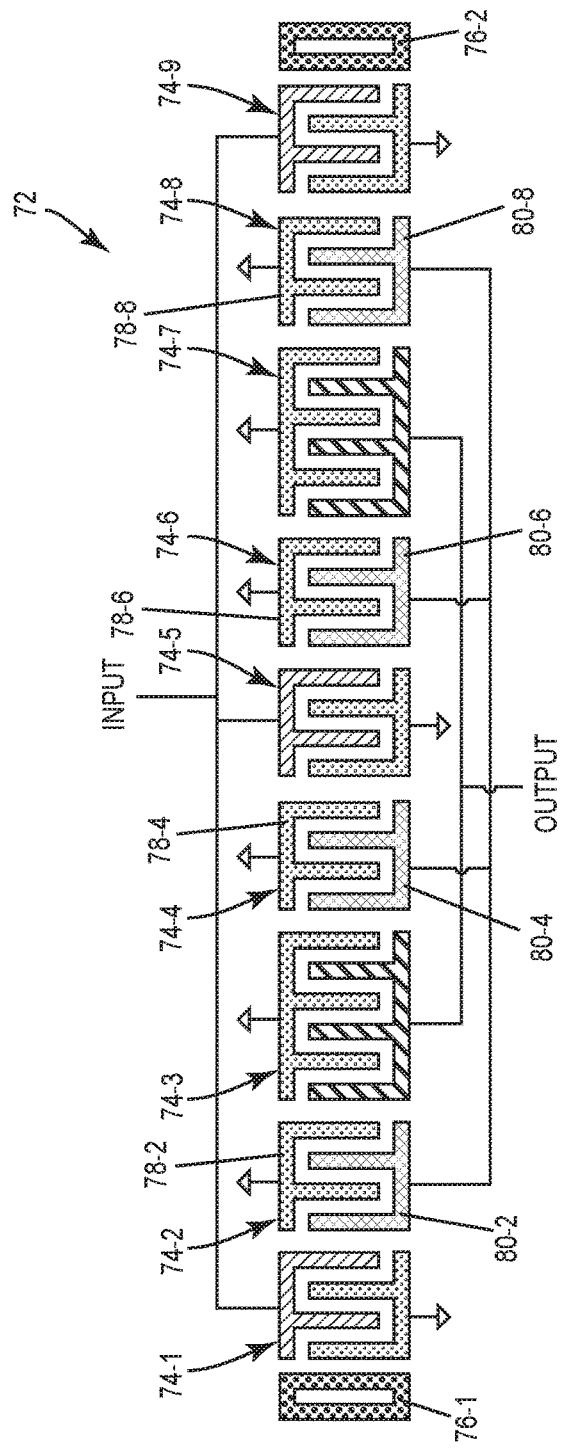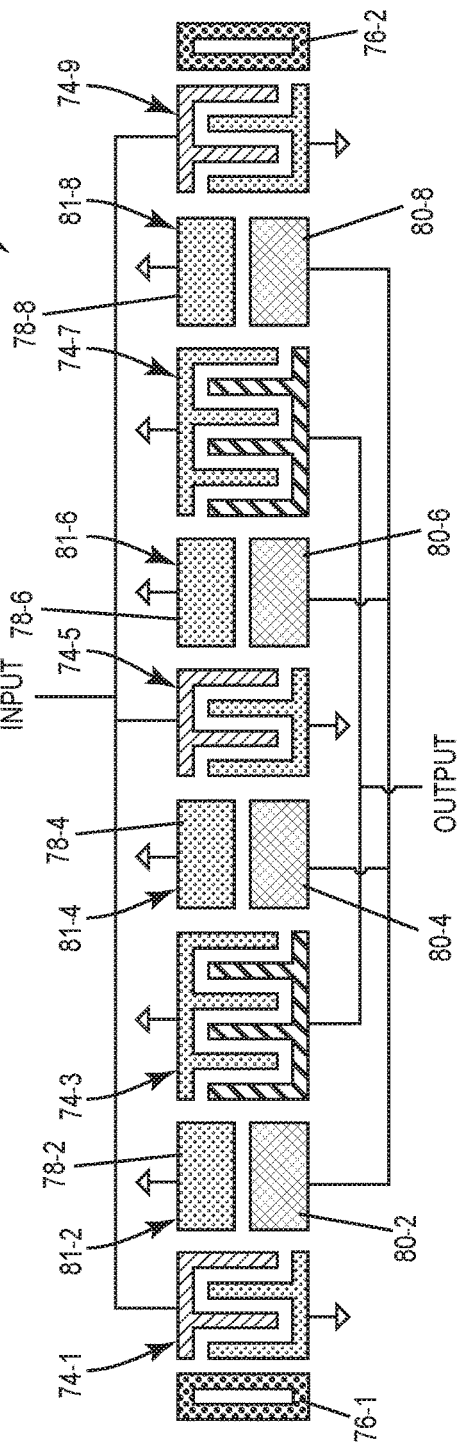

INTERDIGITAL TRANSDUCER ARRANGEMENTS FOR SURFACE ACOUSTIC WAVE DEVICES

RELATED APPLICATIONS

This application claims the benefit of provisional patent application Ser. No. 62/698,509, filed Jul. 16, 2018, the disclosure of which is hereby incorporated herein by reference in its entirety.

FIELD OF THE DISCLOSURE

The present disclosure relates to acoustic wave devices, and particularly to interdigital transducer (IDT) arrangements for surface acoustic wave (SAW) devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio Frequency (RF) filters. For example, SAW filters are commonly used in second generation (2G), third generation (3G), and fourth generation (4G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW filters in modern RF communication systems increase, there is a need for SAW filters with sharp transitions between desired passband frequencies and frequencies that are outside of desired passbands.

SUMMARY

The present disclosure relates to acoustic wave devices, and particularly to interdigital transducer (IDT) arrangements for surface acoustic wave (SAW) devices. Representative SAW devices are described herein that provide sharp transitions between passband frequencies and frequencies that are outside of desired passbands. In certain embodiments, a SAW device may include several IDTs arranged between reflective structures and one or more additional IDTs or electrode pairs that are configured to modify the influence of parasitic capacitance, or other internal device capacitance, thereby improving steepness on the upper side of a passband as well as improving rejection for frequencies outside of the passband. The one or more additional IDTs or electrode pairs may be configured as at least one of a capacitor, an IDT capacitor, an IDT with a floating electrode, or combinations thereof.

In one aspect, a SAW device, comprises a piezoelectric material, at least one input IDT on the piezoelectric material and electrically connected to an input signal and ground; at least one output IDT on the piezoelectric material and electrically connected to an output signal and ground; and an additional IDT on the piezoelectric material and electrically connected to the input signal and the output signal, wherein the additional IDT is arranged between the at least one input IDT and the at least one output IDT. In certain embodiments, the additional IDT comprises an IDT capacitor. The additional IDT may comprise a first electrode electrically connected to the input signal and a second electrode electrically connected to the output signal. The SAW device may further comprise a first reflective structure and a second reflective structure on the piezoelectric material, wherein the at least one input IDT, the at least one output IDT and the additional IDT are arranged between the first reflective structure and the second reflective structure. In certain embodiments, the at least one input IDT comprises a plurality of input IDTs and the at least one output IDT comprises a plurality of output IDTs. The plurality of input IDTs and the plurality of output IDTs may be configured in an alternating arrangement. In certain embodiments, at least one of the at least one input IDT, the at least one output IDT, and the additional IDT comprises an apodized IDT.

In another aspect, a SAW device comprises a piezoelectric material, at least one input IDT on the piezoelectric material and electrically connected to an input signal and ground; at least one output IDT on the piezoelectric material and electrically connected to an output signal and ground; a first additional electrode pair on the piezoelectric material and electrically connected to the input signal and the output signal; and a second additional electrode pair arranged between the at least one input IDT and the least one output second IDT, wherein the second additional electrode pair comprises at least one floating electrode. The SAW device may further comprise a first reflective structure and a second reflective structure on the piezoelectric material, wherein the at least one input IDT, the at least one output IDT, the first additional electrode pair, and the second additional electrode pair are arranged between the first reflective structure and the second reflective structure. In certain embodiments, the second additional electrode pair comprises a first electrode that is electrically connected to the input signal, a second electrode that is electrically connected to the output signal, and a floating electrode. In certain embodiments, the second additional electrode pair is not directly electrically connected to either of the input signal and the output signal. In certain embodiments, the second additional electrode pair comprises a first electrode and a second electrode and at least one of the first electrode and the second electrode is devoid of electrode fingers. In certain embodiments, at least one of the first additional electrode pair and the second additional electrode pair comprises an additional IDT. At least one of the input IDT and the output IDT may comprise an apodized IDT In another aspect, a SAW device comprises a piezoelectric material; a first reflective structure and a second reflective structure on the piezoelectric material; a plurality of input IDTs and a plurality of output IDTs arranged on the piezoelectric material and between the first reflective structure and the second reflective structure, wherein the plurality of input IDTs and the plurality of output IDTs are configured in an alternating arrangement between the first reflective structure and the second reflective structure; and a plurality of additional IDTs arranged between corresponding ones of the plurality of input IDTs and corresponding ones of the plurality of output IDTs, wherein at least one additional IDT of the plurality of additional IDTs is electrically connected to an input signal and an output signal. In certain embodiments, the plurality of additional IDTs comprises at least two additional IDTs electrically connected to an input signal and an output signal. The at least one additional IDT of the plurality of additional IDTs may comprise a first electrode that is electrically connected to the input signal, a second electrode that is electrically connected to the output signal, and a floating electrode. In certain embodiments, at least one other additional IDT of the plurality of additional IDTs is not directly electrically connected to either of the input signal and the output signal. The at least one other additional IDT of the plurality of additional IDTs may comprise a first electrode electrically connected to ground and a second electrode that is a floating electrode. At least one of the plurality of input IDTs, the plurality of output IDTs, and the plurality of additional IDTs may comprise a metallization ratio in a range of about 0.2 to about 0.8. At least one of the plurality of input IDTs, the plurality of output IDTs, and the plurality of additional IDTs may comprise an apodized IDT.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9A illustrates a different SAW CRF structure that includes a plurality of IDTs that are longitudinally coupled between two reflective structures according to embodiments disclosed herein.

FIG. 9B illustrates an alternative configuration for the SAW CRF structure of FIG. 9A.

DETAILED DESCRIPTION

Figure 1:
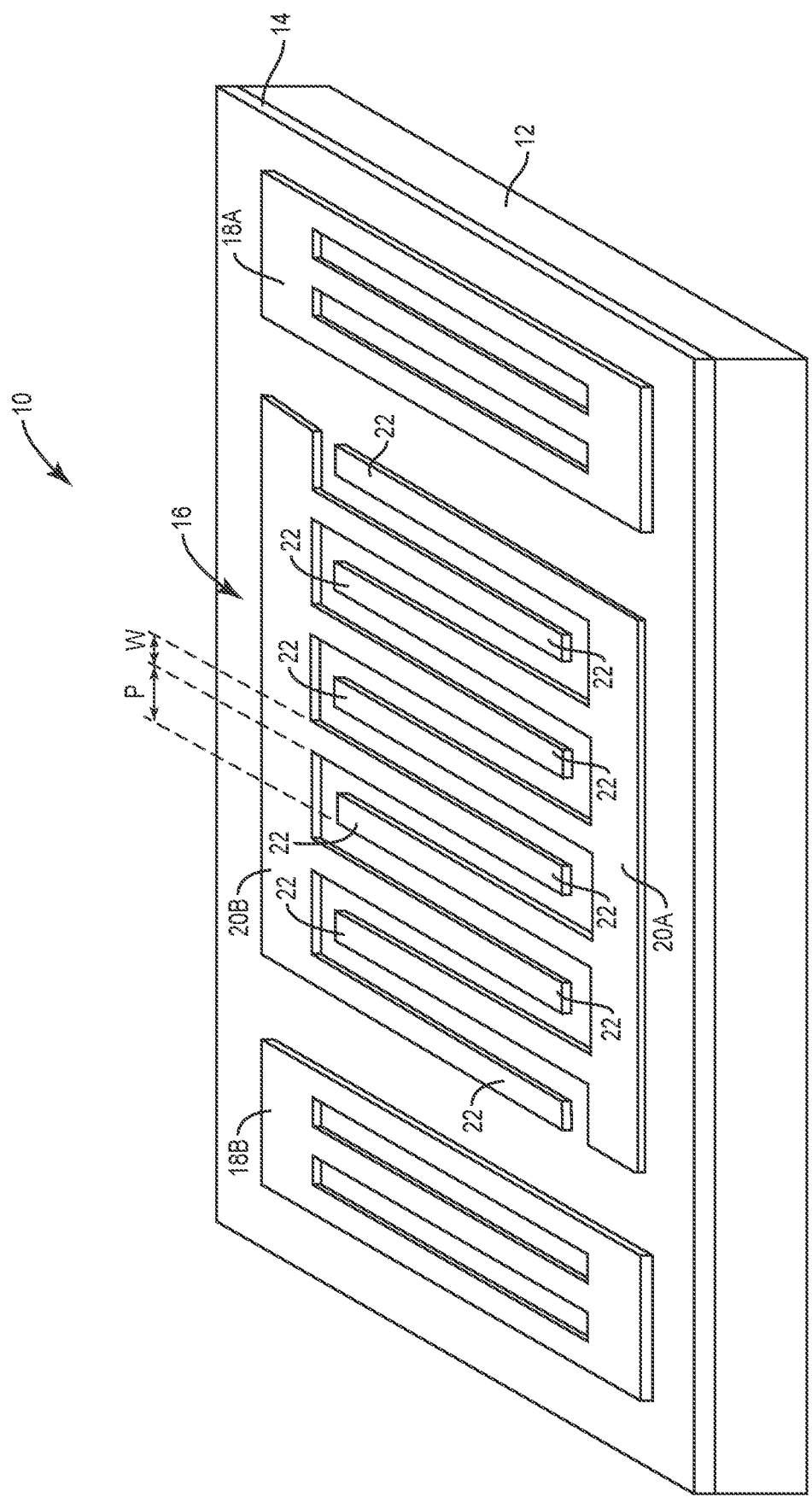
FIG. 1 is a perspective view illustration of a representative surface acoustic wave (SAW) device 10.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic wave devices, and particularly to interdigital transducer (IDT) arrangements for surface acoustic wave (SAW) devices. Representative SAW devices are described herein that provide sharp transitions between passband frequencies and frequencies that are outside of desired passbands. In certain embodiments, a SAW device may include several IDTs arranged between reflective structures and one or more additional IDTs or electrode pairs that are configured to modify the influence of parasitic capacitance, or other internal device capacitance, thereby improving steepness on the upper side of a passband as well as improving rejection for frequencies outside of the passband. The one or more additional IDTs or electrode pairs may be configured as at least one of a capacitor, an IDT capacitor, an IDT with a floating electrode, or combinations thereof.

Before describing particular embodiments of the present disclosure further, a general discussion of SAW devices is provided. FIG. 1 is a perspective view illustration of a representative SAW device 10. The SAW device 10 includes a substrate 12, a piezoelectric layer 14 on the substrate 12, an IDT 16 on a surface of the piezoelectric layer 14 opposite the substrate 12, a first reflector structure 18A on the surface of the piezoelectric layer 14 adjacent to the IDT 16, and a second reflector structure 18B on the surface of the piezoelectric layer 14 adjacent to the IDT 16 opposite the first reflector structure 18A.

The IDT 16 includes a first electrode 20A and a second electrode 20B, each of which include a number of electrode fingers 22 that are interleaved with one another as shown. The first electrode 20A and the second electrode 20B may also be referred to as comb electrodes. A lateral distance between adjacent electrode fingers 22 of the first electrode 20A and the second electrode 20B defines an electrode pitch P of the IDT 16. The electrode pitch P may at least partially define a center frequency wavelength $\lambda$ of the SAW device 10, where the center frequency is the primary frequency of mechanical waves generated in the piezoelectric layer 14 by the IDT 16. For a single electrode IDT 16 such as the one shown in FIG. 1, the center frequency wavelength $\lambda$ is equal to twice the electrode pitch P. For a double electrode IDT 16, the center frequency wavelength $\lambda$ is equal to four times the electrode pitch P. A finger width W of the adjacent electrode fingers 22 over the electrode pitch P may define a metallization ratio, or duty factor, of the IDT 16, which may dictate certain operating characteristics of the SAW device 10.

In operation, an alternating electrical input signal provided at the first electrode 20A is transduced into a mechanical signal in the piezoelectric layer 14, resulting in one or more acoustic waves therein. In the case of the SAW device 10, the resulting acoustic waves are predominately surface acoustic waves. As discussed above, due to the electrode pitch P and the metallization ratio of the IDT 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first electrode 20A and the second electrode 20B with respect to the frequency of the alternating electrical input signal. An alternating electrical potential between the two electrodes 20A and 20B creates an electrical field in the piezoelectric material which generate acoustic waves. The acoustic waves travel at the surface and eventually are transferred back into an electrical signal between the electrodes 20A and 20B. The first reflector structure 18A and the second reflector structure 18B reflect the acoustic waves in the piezoelectric layer 14 back towards the IDT 16 to confine the acoustic waves in the area surrounding the IDT 16.

The substrate 12 may comprise various materials including glass, sapphire, quartz, silicon (Si), or gallium arsenide (GaAs) among others, with Si being a common choice. The piezoelectric layer 14 may be formed of any suitable piezoelectric material(s). In certain embodiments described herein, the piezoelectric layer 14 is formed of lithium tantalate (LT), or lithium niobate (LiNbO$_3$), but is not limited thereto. In certain embodiments, the piezoelectric layer 14 is thick enough or rigid enough to function as a piezoelectric substrate. Accordingly, the substrate 12 in FIG. 1 may be omitted. Those skilled in the art will appreciate that the principles of the present disclosure may apply to other materials for the substrate 12 and the piezoelectric layer 14. The IDT 16, the first reflector structure 18A, and the second reflector structure 18B may comprise aluminum (Al). While not shown to avoid obscuring the drawings, additional passivation layers, frequency trimming layers, or any other layers may be provided over all or a portion of the exposed surface of the piezoelectric layer 14, the IDT 16, the first reflector structure 18A, and the second reflector structure 18B. Further, one or more layers may be provided between the substrate 12 and the piezoelectric layer 14 in various embodiments.

Figure 2A:
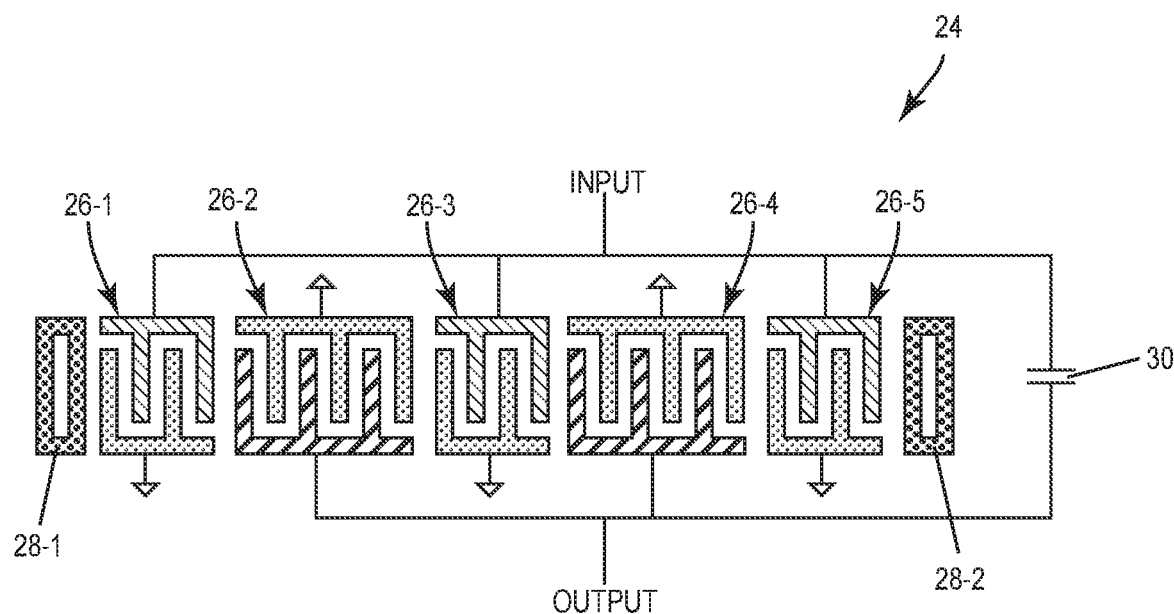
FIG. 2A illustrates an example SAW couple resonated filter (CRF) structure that includes a plurality of interdigital transducers (IDTs) that are acoustically and longitudinally coupled between two reflective structures.

SAW devices may be configured in so-called coupled resonator filter (CRF) or double mode SAW (DMS) filter arrangements. A typical CRF is designed by placing several IDTs between two reflective structures, or gratings. FIG. 2A illustrates an example SAW CRF structure 24 that includes a plurality of IDTs 26-1 to 26-5 that are longitudinally coupled between two reflective structures 28-1, 28-2. A substrate (e.g., 12 of FIG. 1) and piezoelectric layer (e.g., 14 of FIG. 1) are not shown. The IDTs 26-1, 26-3, and 26-5 are electrically connected to an input signal and ground, and may therefore be referred to as input IDTs. The IDTs 26-2, 26-4 are electrically connected to an output signal and ground, and may be referred to as output IDTs. The input IDTs 26-1, 26-3, and 26-5 are configured in an alternating arrangement between the two reflective structures 28-1, 28-2. In operation, surface acoustic waves are generated by the input IDTs 26-1, 26-3, and 26-5 in response to an input signal and the surface acoustic waves are acoustically coupled to the output IDTs 26-2, 26-4 where they are converted back to an output signal. As discussed above, the electrode pitch and the metallization ratio of the plurality of IDTs 26-1 to 26-5, the characteristics of the material of the underlying piezoelectric layer, and other factors influence the magnitude and frequency of the acoustic waves transduced and filtered by the SAW CRF structure 24. It is desirable for the SAW CRF structure 24 to highly attenuate or reject frequencies outside of a desired passband. In practice, an internal or parasitic capacitance within the SAW CRF structure 24 may exist between the input IDTs 26-1, 26-3, and 26-5 and the output IDTs 26-2, 26-4. This capacitance can limit the rejection response of the SAW CRF structure 24, particularly at frequencies above the passband, where a shoulder may be visible in plots of the frequency response. One way to reduce the influence of this capacitance is to place a capacitor 30 that is electrically coupled between the input signal and the output signal and outside of a cavity between the two reflective structures 28-1, 28-2. In effect, this creates electrical zeros on either side of the passband while coupling adjacent resonance modes within the cavity between the two reflective structures 28-1, 28-2. In some examples, the capacitor 30 can include an IDT connected between the input signal and the output signal outside of the reflective structures 28-1, 28-2.

Figure 2B:
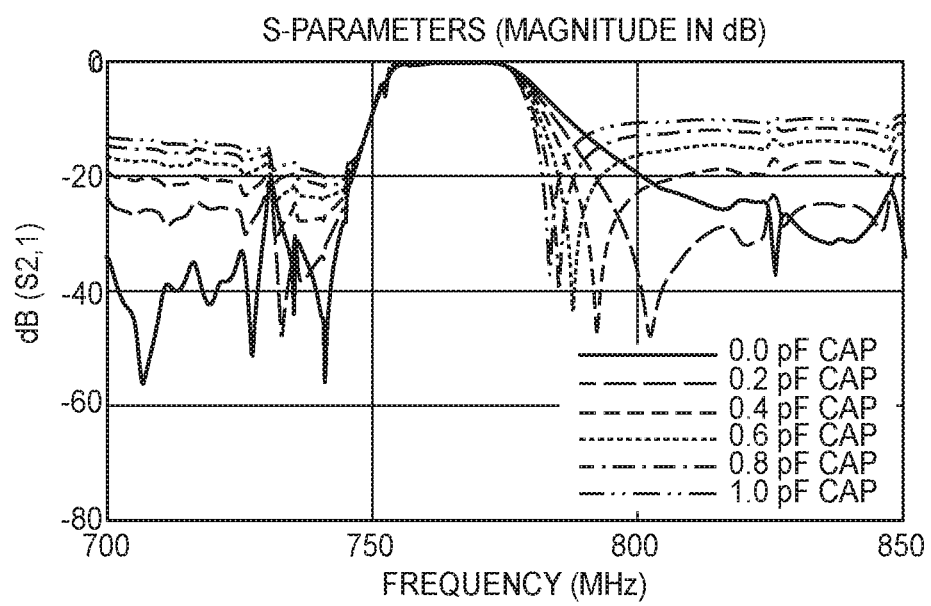
FIG. 2B is an S-Parameters plot representing simulations of the SAW CRF structure of FIG. 2A with a variety of capacitor values.

While providing improvement in the rejection response above a desired passband, the use of a capacitor as illustrated in FIG. 2A does have performance limitations. FIG. 2B is an S-Parameters plot representing simulations of the SAW CRF structure 24 of FIG. 2A with a variety of capacitor 30 values. The S-parameter magnitude is plotted in decibels (dB) across a megahertz (MHz) frequency range. Insertion loss, or S2,1, is an indication of how much power is transferred. For frequencies where S2,1 is at or near 0 dB, then substantially all power from a signal is transferred. Accordingly, a passband is illustrated where the S2,1 values are at or near 0 dB. On either side of the passband, or the shoulder regions, the S2,1 values decrease rapidly. As the S2,1 value becomes farther away from 0 dB, more and more power is reflected and/or attenuated. For example, a value of −40 dB reflects more power than a value of −20 dB. FIG. 2B represents model simulations for the SAW CRF structure 24 of FIG. 2A with the capacitor 30 values starting at 0.0 picofarad (pF), or no capacitor, and progressively increasing to values of 0.2 pF, 0.4 pF, 0.6 pF, 0.8 pF, and 1.0 pF. As illustrated, a capacitor 30 value of 0.0 pF provides a shoulder above the passband that has a gradual slope. As the capacitor 30 values progressively increase from 0.2 pF to 1.0 pF, the gradual shoulder is steadily decreased to provide a steeper transition between passing frequencies and attenuated or filtered frequencies. Despite the improved shoulder steepness for the passband, a trade-off exists for increasing capacitor 30 values. As shown in the higher frequency ranges above the passband and shoulder region, such as between about 800 MHz and 850 MHz range, each increasing capacitor 30 value negatively impacts the rejection response.

According to embodiments disclosed herein, a SAW device may comprise a piezoelectric material, at least one input IDT on the piezoelectric material and electrically connected to an input signal and ground, at least one output IDT on the piezoelectric material and electrically connected to an output signal and ground, and an additional IDT on the piezoelectric material and located between an input IDT and an output IDT. The additional IDT may comprise corresponding electrodes that are respectively connected to the input signal and the output signal for the SAW device. In this manner, the additional IDT may alter an internal device capacitance to provide a sharper transition, or improved passband steepness, between frequencies in and out of a passband. Additionally, by placing the additional IDT between the input IDT and the output IDT, rejection of frequencies further above the passband may also be improved.

Figure 3:
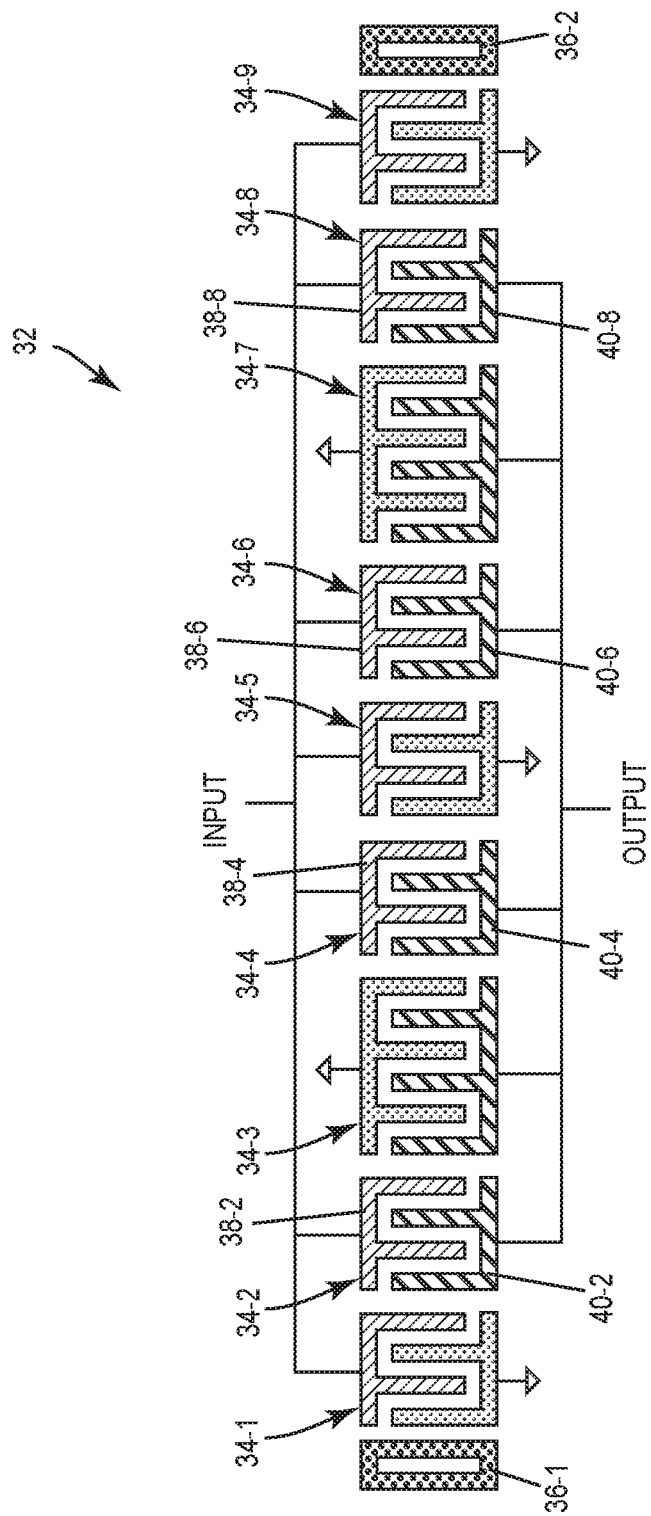
FIG. 3 illustrates a SAW CRF structure that includes a plurality of IDTs that are longitudinally coupled between two reflective structures.

FIG. 3 illustrates a SAW CRF structure 32 that includes a plurality of IDTs 34-1 to 34-9 that are longitudinally coupled between two reflective structures 36-1, 36-2. A substrate (e.g., 12 of FIG. 1) and a piezoelectric layer (e.g., 14 of FIG. 1) are not shown. Each of the IDTs 34-1, 34-5, 34-9 comprise corresponding electrodes that are electrically connected to an input signal and ground, and may be referred to as input IDTs. Each of the IDTs 34-3, 34-7 comprise corresponding electrodes that are electrically connected to an output signal and ground, and may be referred to as output IDTs. As illustrated in FIG. 3, the input IDTs 34-1, 34-5, 34-9 and the output IDTs 34-3, 34-7 may be configured in an alternating arrangement between the two reflective structures 36-1, 36-2. The IDTs 34-2, 34-4, 34-6, 34-8 are additional IDTs that are electrically connected to the input signal and the output signal. In this manner, the additional IDTs 34-2, 34-4, 34-6, 34-8 are neither input IDTs nor output IDTs. In particular, each of the additional IDTs 34-2, 34-4, 34-6, 34-8 comprises an electrode pair that includes a corresponding first electrode 38-2, 38-4, 38-6, 38-8 electrically connected to the input signal and a corresponding second electrode 40-2, 40-4, 40-6, 40-8 electrically connected to the output signal. Accordingly, the additional IDTs 34-2, 34-4, 34-6, 34-8 comprise IDT capacitors that alter the internal device capacitance to provide a sharper transition, or improved passband steepness, between frequencies in and out of the passband. The additional IDTs 34-2, 34-4, 34-6, 34-8 may be configured between each pair of alternating input IDTs 34-1, 34-5, 34-9 and output IDTs 34-3, 34-7. For example, the additional IDT 34-2 is configured between the input IDT 34-1 and the output IDT 34-3, the additional IDT 34-4 is configured between output IDT 34-3 and the input IDT 34-5, and so on. In operation, surface acoustic waves that are generated by the input IDTs 34-1, 34-5, 34-9 in response to an input signal are acoustically coupled to the output IDTs 34-3, 34-7 through the additional IDTs 34-2, 34-4, 34-6, 34-8. In this manner, the additional IDTs 34-2, 34-4, 34-6, 34-8 also influence the passband of the device and may be configured to improve rejection performance outside of the passband. For example, the additional IDTs 34-2, 34-4, 34-6, 34-8 may be designed to acoustically pass only frequencies within a desired passband, thereby altering the phase of frequencies outside of the passband. One or more of the additional IDTs 34-2, 34-4, 34-6, 34-8 may be placed in various positions between the reflective structures 36-1, 36-2 depending on the desired passband of a particular application. In this regard, the location of electrical zeros and/or poles within the SAW CRF structure 32 can be tailored for various applications. In certain embodiments, one or more of the plurality of IDTs 34-1 to 34-9 may comprise a metallization ratio, or duty factor, of any range between 0 and 1 of a center wavelength A. In certain embodiments, the metallization ration is in a range of about 0.1 to about 0.9; or in a range of about 0.2 to about 0.8; or in a range of about 0.3 to about 0.7; or in a range of about 0.4 to about 0.5. In certain embodiments, the metallization ratio comprises a value of about 0.4, or a value of about 0.5. For simplicity, FIG. 3 as well as figures for subsequent embodiments, illustrate the plurality of IDTs 34-1 to 34-9 as unapodized IDTs where each of the IDT electrode fingers has a uniform length. In certain embodiments, one or more of the plurality of IDTs 34-1 to 34-9 may comprise an apodized IDT where electrode fingers have different lengths at different positions along the apodized IDT that are configured for a particular response function.

SAW devices according to embodiments disclosed herein may be incorporated within larger devices and systems to provide simplified layouts or topologies. FIGS. 4A, 4B, 5A, and 5B illustrate representative radio frequency (RF) duplexing devices with various SAW CRF devices as disclosed herein. RF duplexing devices typically are configured to receive signals and transmit signals of a different band using a common antenna. One of the primary challenges of duplexing is that RF transmission signals and RF receive signals can interfere with one another and accordingly, RF duplexing devices may employ one or more filters to improve isolation.

Figure 4A:
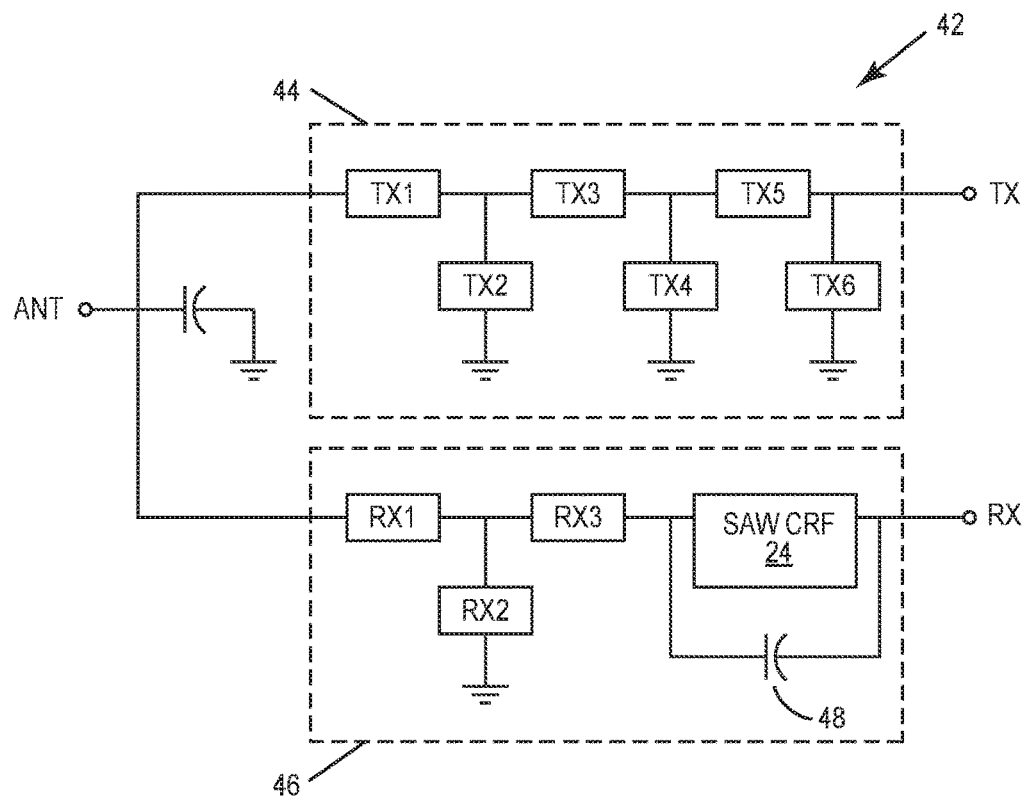
FIG. 4A is a block diagram of a radio frequency (RF) duplexer that includes the SAW CRF structure of FIG. 2A.
Figure 4B:
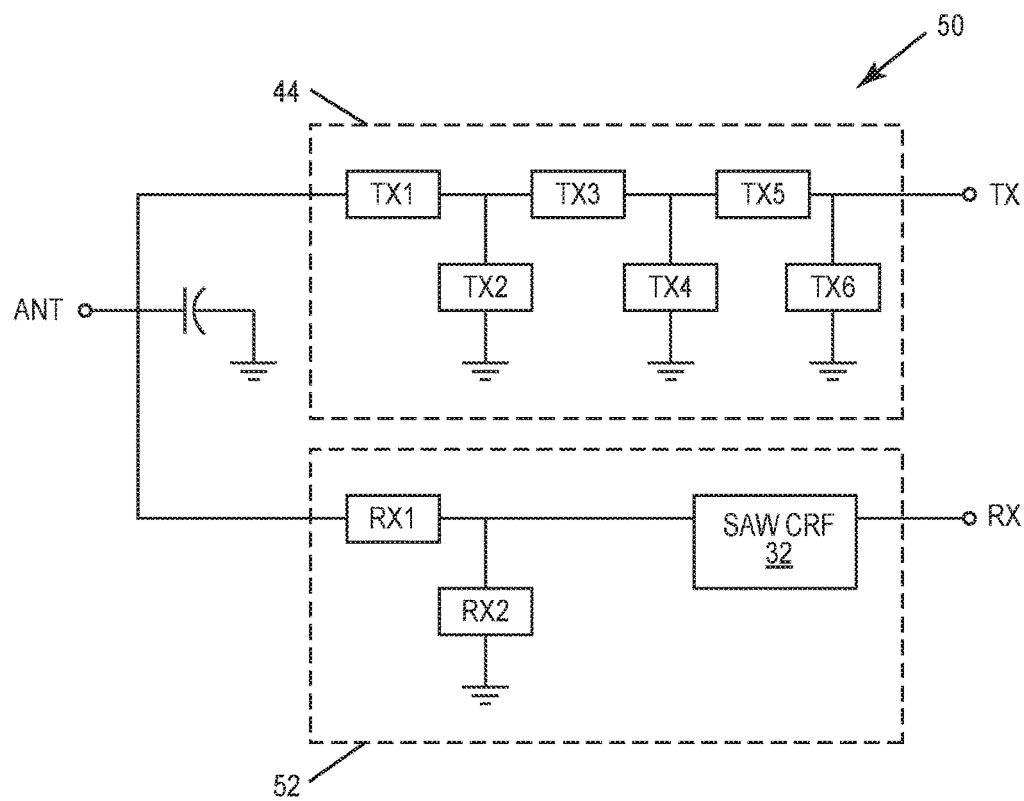
FIG. 4B is a block diagram of an RF duplexer that includes the SAW CRF structure of FIG. 3.

FIG. 4A is a block diagram of an RF duplexer 42 that includes the SAW CRF structure 24 of FIG. 2A. The RF duplexer 42 includes a transmit (TX) port, a receive (RX) port, and an antenna (ANT) port. A TX filter 44 is positioned between the TX port and the antenna port and an RX filter 46 is positioned between the RX port and the antenna port. The TX filter 44 is configured as a ladder filter with series resonators TX1, TX3, TX5 and shunt resonators TX2, TX4, TX6. The RX filter 46 includes series resonators RX1, RX3, and a shunt resonator RX2 as well as the SAW CRF structure 24 as previously described for FIG. 2A. The SAW CRF structure 24 includes five IDTs that alternate between input IDTs and output IDTs and a capacitor 48 is connected between the input and output of the SAW CRF structure 24. FIG. 4B is a block diagram of an RF duplexer 50 that includes the SAW CRF structure 32 of FIG. 3. The RF duplexer 50 includes the TX filter 44 of FIG. 4A between the TX port and the antenna port, but an RX filter 52 that is different. The RX filter 52 includes the SAW CRF structure 32 where an additional IDT as previously described is positioned between each of the five total alternating input IDTs and output IDTs. In this regard, the capacitor 48 and the series resonator RX3 of FIG. 4A may be omitted, thereby saving costs and die space in device layouts.

Figure 5B:
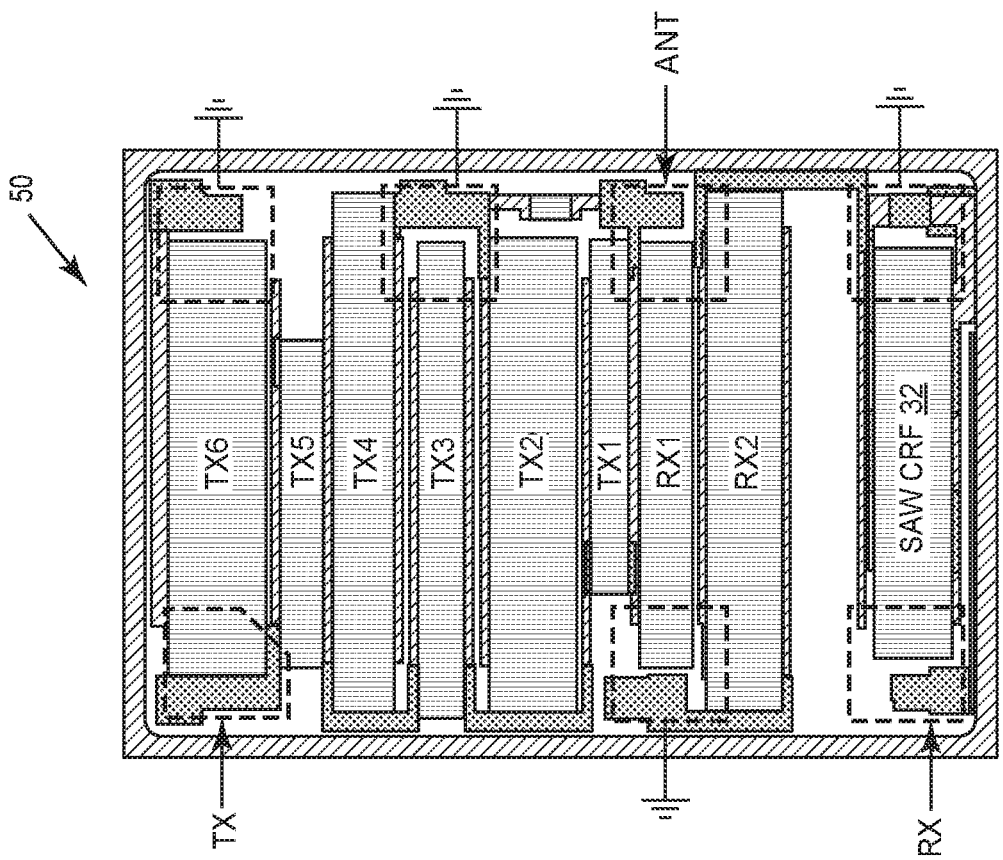
FIG. 5B is a top view of a device layout of the RF duplexer of FIG. 4B.
Figure 5A:
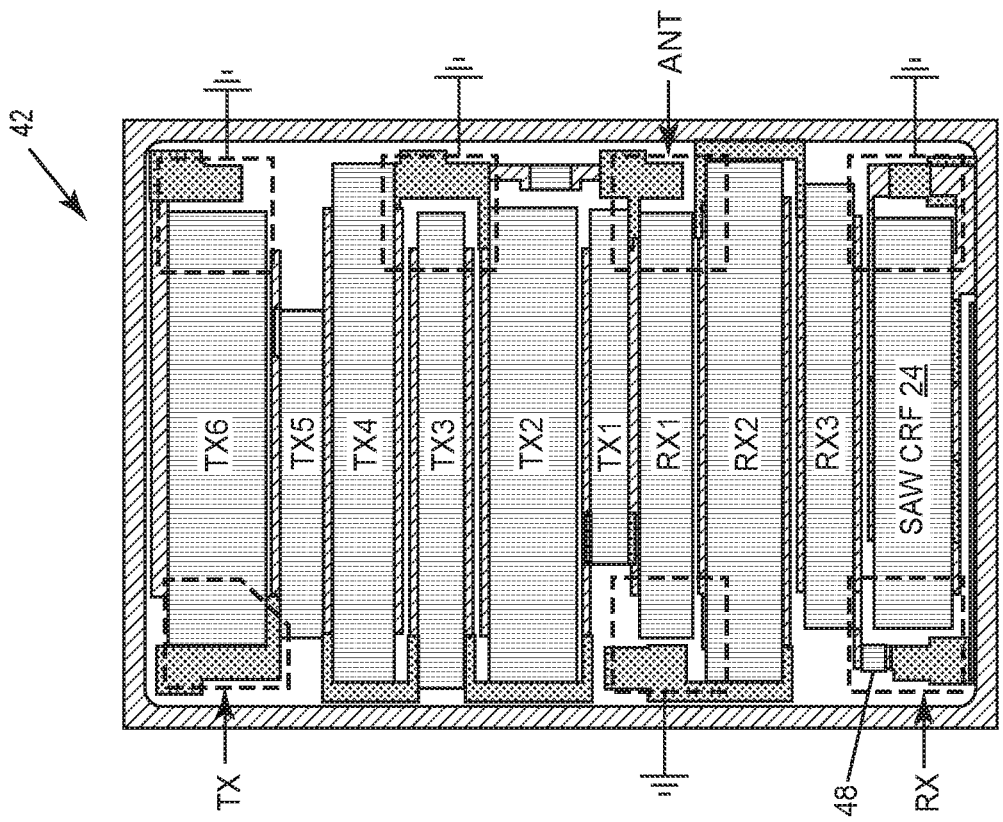
FIG. 5A is a top view of a device layout of the RF duplexer of FIG. 4A.

FIG. 5A is a top view of a device layout of the RF duplexer 42 of FIG. 4A. As illustrated, the RF duplexer 42 includes the resonators TX1 to TX6, the resonators RX1 to RX3, the SAW CRF structure 24, and the capacitor 48 as previously described as well as areas for RX, TX, antenna, and various ground connections. FIG. 5B is a top view of a device layout of the RF duplexer 50 of FIG. 4B. As illustrated, the RF duplexer 50 includes the resonators TX1 to TX6, the resonators RX1 to RX2, and the SAW CRF structure 32 as previously described as well as areas for RX, TX, antenna, and various ground connections. Due to the configuration of the SAW CRF structure 32, the RF duplexer 50 does not include the capacitor 48 and the resonator RX3 of FIG. 5A. Additionally, the series resonator RX1 may have a reduced size. In this regard, there is noticeably improved die space savings between the SAW CRF structure 32 and the resonator RX2 as well as between the resonator RX1 and the ground connection for the resonator RX2.

Figure 6A:
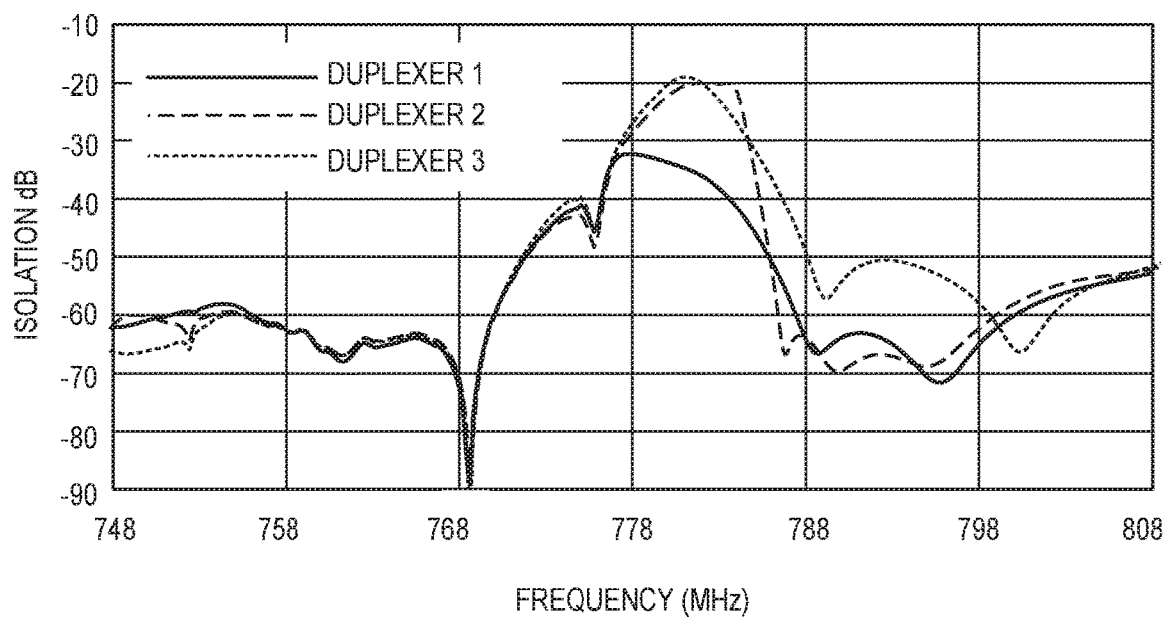
FIG. 6A is a comparison plot for isolation of RF duplexers with various SAW CRF structures as disclosed herein.
Figure 6B:
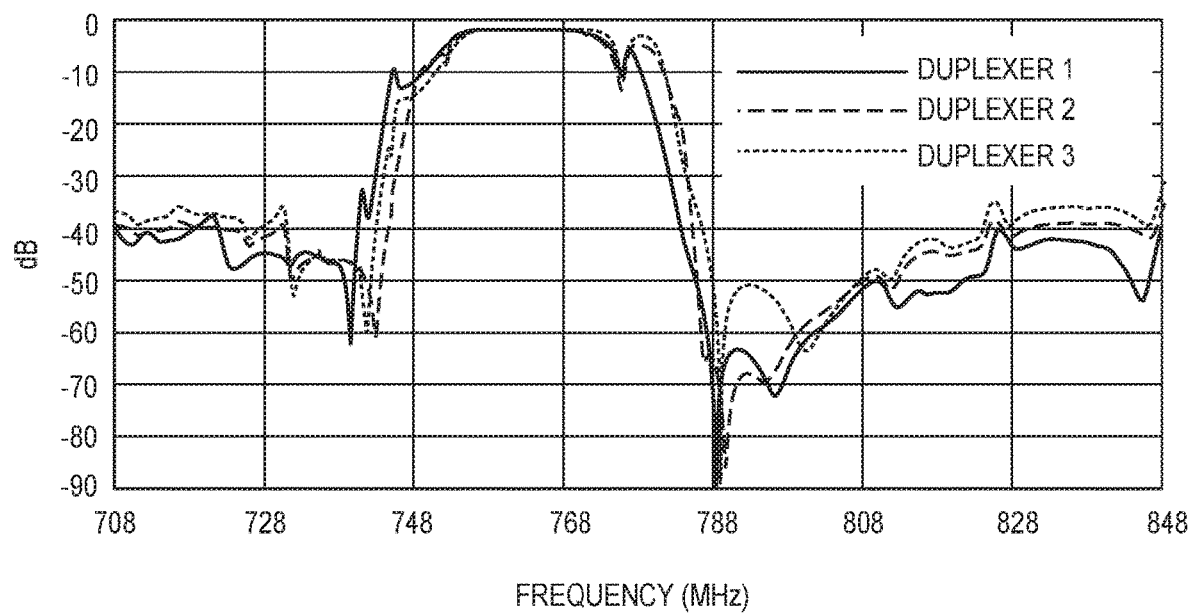
FIG. 6B is a comparison plot for a passband of RF duplexers with various SAW CRF structures as disclosed herein.

FIGS. 6A and 6B are plots comparing the performance of RF duplexers with various SAW CRF structures as disclosed herein. In FIGS. 6A and 6B, Duplexer 1 refers to the RF duplexer 50 of FIG. 4B that includes the SAW CRF structure 32 according to embodiments disclosed herein. Duplexer 2 refers to the RF duplexer 42 of FIG. 4A that includes the SAW CRF structure 24 and the capacitor 48. For the sake of comparison, Duplexer 3 was included and refers to the RF duplexer 42 of FIG. 4A, but with the series resonator RX3 removed. In this regard, a comparison of Duplexer 1 and Duplexer 3 is useful to highlight the influence of just replacing the SAW CRF structure 24 and the capacitor 48 of FIG. 4A with the SAW CRF structure 32 of FIG. 4B. FIG. 6A is a comparison plot for duplexer isolation in dB for Duplexers 1, 2, and 3, where a lower value indicates better isolation. As illustrated, Duplexer 1 has noticeably better isolation (e.g. 5 dB or more) than Duplexer 3, particularly in the frequency range above 778 MHz. Additionally, Duplexers 1 and 2 show similar isolation values across the frequency range. FIG. 6B is a comparison plot for the passband of the Duplexers 1, 2, and 3. As described for FIG. 2B, a passband is illustrated where the plot values are at or near 0 dB with shoulder regions on either side where the plot values noticeably decrease from 0 dB. As previously described, it is desirable to have a passband with sharp or steep shoulders that transition to high rejection performance on either side of the passband. As illustrated, Duplexer 1 shows a steep shoulder on the high frequency side of the passband and has noticeably improved rejection for regions above and below the passband. In particular, Duplexer 1 demonstrates an improvement of at least 2 dB or more for frequencies in the range of about 817 MHz to about 828 MHz.

Figure 7:
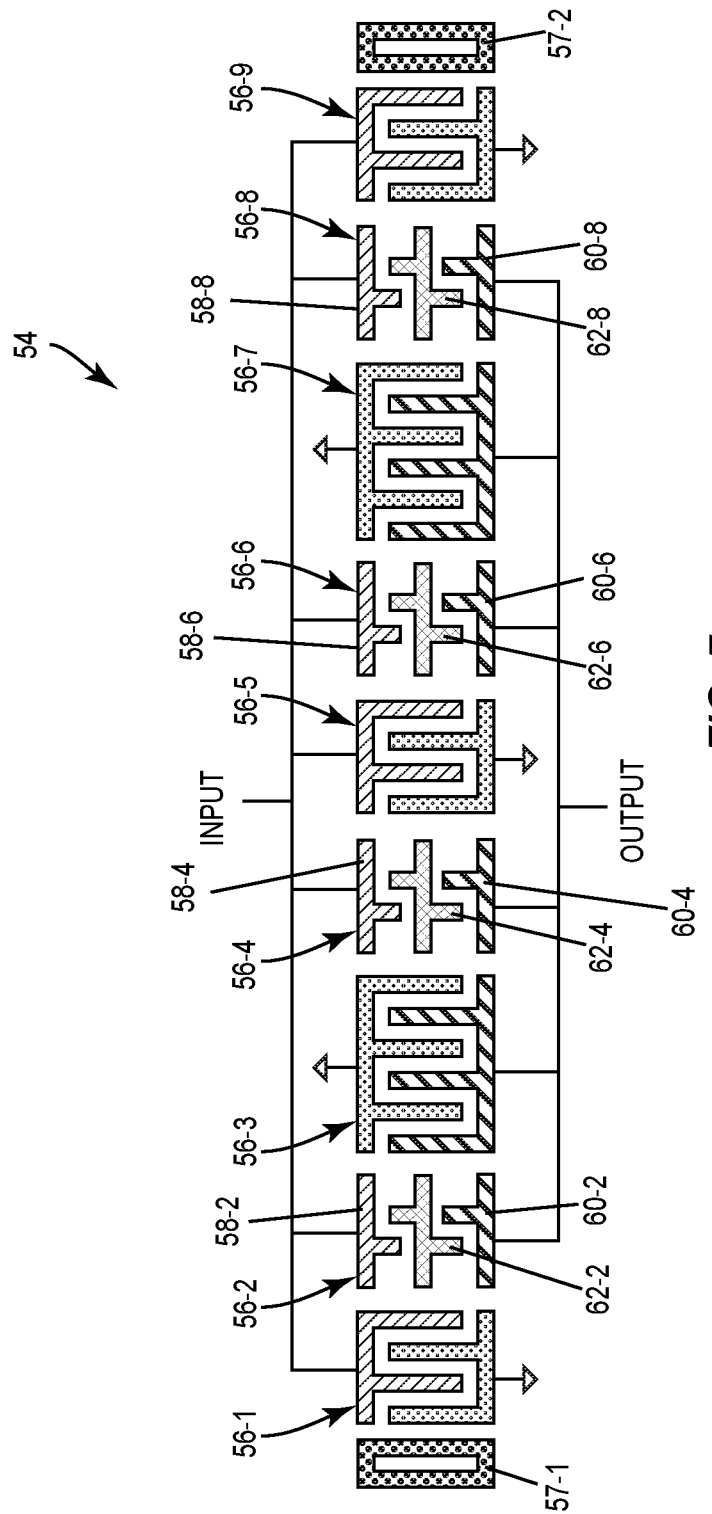
FIG. 7 illustrates a SAW CRF structure that includes a plurality of IDTs that are longitudinally coupled between two reflective structures according to embodiments disclosed herein.

As previously described, a SAW device may comprise at least one additional IDT located between an input IDT and an output IDT on a piezoelectric material. In certain embodiments, the at least one additional IDT may include an IDT capacitor with a floating electrode. FIG. 7 illustrates a SAW CRF structure 54 that includes a plurality of IDTs 56-1 to 56-9 that are longitudinally coupled between two reflective structures 57-1, 57-2. A substrate (e.g. 12 of FIG. 1) and a piezoelectric layer (e.g., 14 of FIG. 1) are not shown. As previously described, each of the IDTs 56-1, 56-5, 56-9 comprise corresponding electrodes that are electrically connected to an input signal and ground, and may be referred to as input IDTs. Each of the IDTs 56-3, 56-7 comprise corresponding electrodes that are electrically connected to an output signal and ground, and may be referred to as output IDTs. As illustrated in FIG. 7, the input IDTs 56-1, 56-5, 56-9 and the output IDTs 56-3, 56-7 may be configured in an alternating arrangement between the two reflective structures 57-1, 57-2. The IDTs 56-2, 56-4, 56-6, 56-8 are additional IDTs that are electrically connected to the input signal and the output signal. In this manner, the additional IDTs 56-2, 56-4, 56-6, 56-8 are neither input IDTS nor output IDTs. In particular, each of the additional IDTs 56-2, 56-4, 56-6, 56-8 comprises an electrode pair that includes a corresponding first electrode 58-2, 58-4, 58-6, 58-8 electrically connected to the input signal and a corresponding second electrode 60-2, 60-4, 60-6, 60-8 electrically connected to the output signal. Each of the additional IDTs 56-2, 56-4, 56-6, 56-8 also includes a corresponding floating electrode 62-2, 62-4, 62-6, 62-8 in between the first electrode 58-2, 58-4, 58-6, 58-8 and the second electrode 60-2, 60-4, 60-6, 60-8. Each floating electrode 62-2, 62-4, 62-6, 62-8 is not directly connected to either of the input signal or the output signal, and may therefore be referred to as floating voltage electrodes. Accordingly, the additional IDTs 56-2, 56-4, 56-6, 56-8 comprise IDT capacitors with floating electrodes that may effectively form multiple capacitors in series within each of the additional IDTs 56-2, 56-4, 56-6, 56-8. In this manner, the additional IDTs 56-2, 56-4, 56-6, 56-8 may alter the internal device capacitance to provide a sharper transition, or improved passband steepness, between frequencies in and out of the passband.

Figure 8:
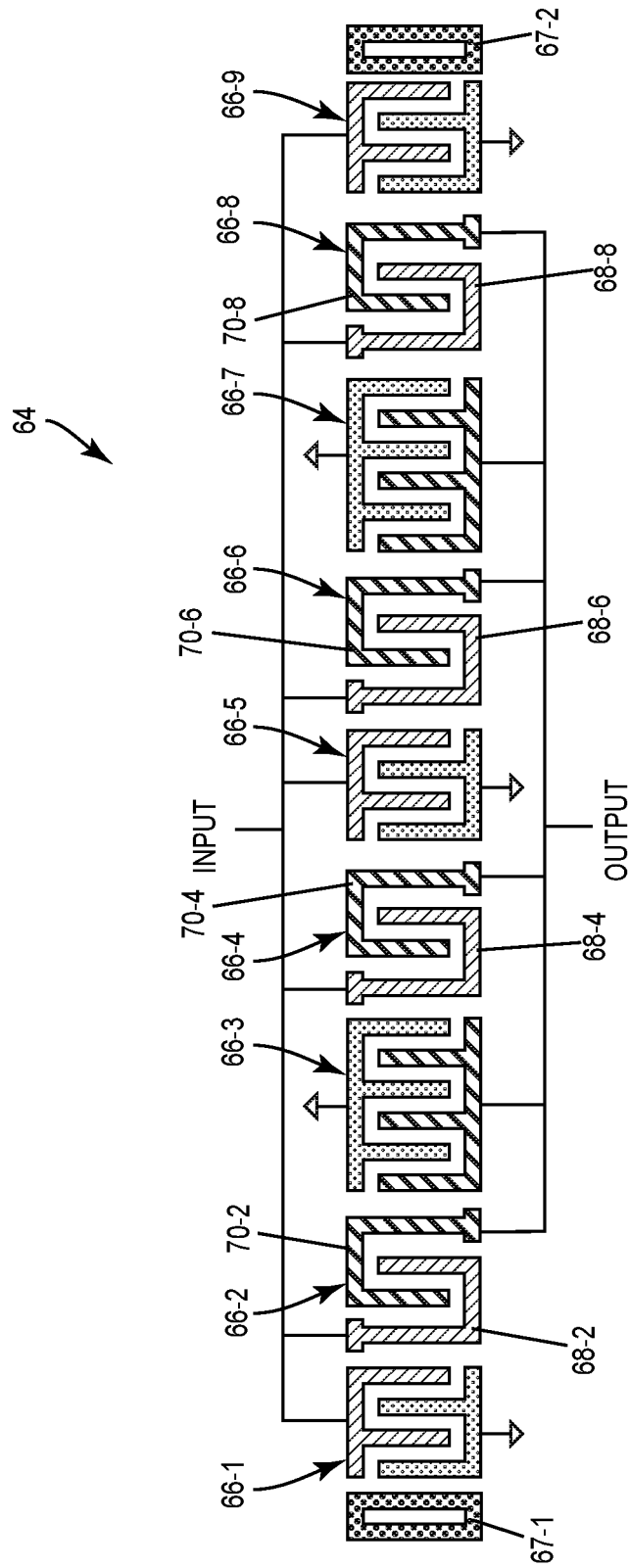
FIG. 8 illustrates a different SAW CRF structure that includes a plurality of IDTs that are longitudinally coupled between two reflective structures according to embodiments disclosed herein.

As previously described, a SAW device may comprise at least one additional IDT located between an input IDT and an output IDT on a piezoelectric material. In certain embodiments, the at least one additional IDT may include electrodes with alternative shapes. FIG. 8 illustrates a SAW CRF structure 64 that includes a plurality of IDTs 66-1 to 66-9 that are acoustically and longitudinally coupled between two reflective structures 67-1, 67-2. A substrate (e.g. 12 of FIG. 1) and a piezoelectric layer (e.g., 14 of FIG. 1) are not shown. The IDTs 66-1, 66-5, 66-9 are input IDTs and the IDTs 66-3, 66-7 are output IDTs as previously described. The IDTs 66-2, 66-4, 66-6, 66-8 are additional IDTs that are electrically connected to the input signal and the output signal, or IDT capacitors as previously described. Each of the additional IDTs 66-2, 66-4, 66-6, 66-8 comprises an electrode pair that includes a corresponding first electrode 68-2, 68-4, 68-6, 68-8 electrically connected to the input signal and a corresponding second electrode 70-2, 70-4, 70-6, 70-8 electrically connected to the output signal. In FIG. 8, the first electrode 68-2, 68-4, 68-6, 68-8 and the second electrode 70-2, 70-4, 70-6, 70-8 comprise elongated fingers that are non-linear. For example, the first electrode 68-2 extends from an input signal line and includes two ninety-degree turns to form a U shape. In a similar manner, the second electrode 70-2 forms an inverted U shape that is interdigitated with the first electrode 68-2. In this regard, the area where the first electrode 68-2 and the second electrode 70-2 are close to each other is increased. In certain embodiments, other electrode shapes are possible. For example, the first electrode 68-2 and the second electrode 70-2 may have curved turns to form a U shape. In certain embodiments, either the first electrode 68-2 or the second electrode 70-2 may comprise a linear shape and the other of first electrode 68-2 or the second electrode 70-2 comprises a non-linear shape. For example, the first electrode 68-2 may comprise a linear shape and the second electrode 70-2 may comprise a U shape that extends around the first electrode 68-2.

In certain embodiments, a SAW device may comprise at least one additional IDT located between an input IDT and an output IDT on a piezoelectric material and the at least one additional IDT is not directly connected to either input or output signals. In certain embodiments, the at least one additional IDT may include a first electrode that is connected to ground and a second electrode that is floating. FIG. 9A illustrates a SAW CRF structure 72 that includes a plurality of IDTs 74-1 to 74-9 that are longitudinally coupled between two reflective structures 76-1, 76-2. A substrate (e.g., 12 of FIG. 1) and a piezoelectric layer (e.g. 14 of FIG. 1) are not shown. The IDTs 74-1, 74-5, 74-9 are input IDTs and the IDTs 74-3, 74-7 are output IDTs as previously described. In FIG. 9A, the IDTs 74-2, 74-4, 74-6, 74-8 are additional IDTs that are not directly connected to the input signal or the output signal. Each of the additional IDTs 74-2, 74-4, 74-6, 74-8 comprises an electrode pair that includes a corresponding first electrode 78-2, 78-4, 78-6, 78-8 electrically connected to ground and a corresponding second electrode 80-2, 80-4, 80-6, 80-8 that is floating. An individual one of the additional IDTs 74-2, 74-4, 74-6, 74-8 is positioned between corresponding pairs of the input IDTs 74-1, 74-5, 74-9 and the output IDTs 74-3, 74-7. Accordingly, a capacitance between the input IDTs 74-1, 74-5, 74-9 and the output IDTs 74-3, 74-7 is reduced, thereby altering the internal device capacitance to provide a sharper transition, or improved passband steepness, between frequencies in and out of the passband. In certain embodiments, each of the second electrodes 80-2, 80-4, 80-6, 80-8 are connected with each other.

FIG. 9B illustrates an alternative configuration for the SAW CRF structure 72 of FIG. 9A. In FIG. 9B, common elements are numbered the same as in FIG. 9A and the description of the common elements provided above for FIG. 9A may also be applicable to FIG. 9B. In FIG. 9B, the first electrodes 78-2, 78-4, 78-6, 78-8 and the second electrodes 80-2, 80-4, 80-6, 80-8 comprise electrodes that are devoid of electrode fingers. In certain embodiments, the first electrodes 78-2, 78-4, 78-6, 78-8 and the second electrodes 80-2, 80-4, 80-6, 80-8 comprise rectangular, square, or other solid shapes. In certain embodiments, at least one of the first electrodes 78-2, 78-4, 78-6, 78-8 and a corresponding one of the second electrodes 80-2, 80-4, 80-6, 80-8 comprise L shapes. In this regard, the SAW CRF structure 72 includes an additional electrode pair 81-2, 81-4, 81-6, 81-8 arranged between the input IDTs 74-1, 74-5, 74-9 and the output IDTs 74-3, 74-7 that is configured to alter the internal or parasitic capacitance of the SAW CRF structure 72.

In certain embodiments, a SAW device may comprise a first reflective structure and a second reflective structure on a piezoelectric material with a plurality of input IDTs and a plurality of output IDTs arranged between the first reflective structure and the second reflective structure. The plurality of input IDTs and the plurality of output IDTs may be configured in an alternating arrangement between the first reflective structure and the second reflective structure, and a plurality of additional IDTs is arranged between corresponding ones of the plurality of input IDTs and corresponding ones of the plurality of output IDTs. In certain embodiments, at least one additional IDT of the plurality of additional IDTs is electrically connected to an input signal and an output signal. In certain embodiments, at least one other additional IDT of the plurality of additional IDTs is not directly electrically connected to either of the input signal and the output signal.

Figure 10:
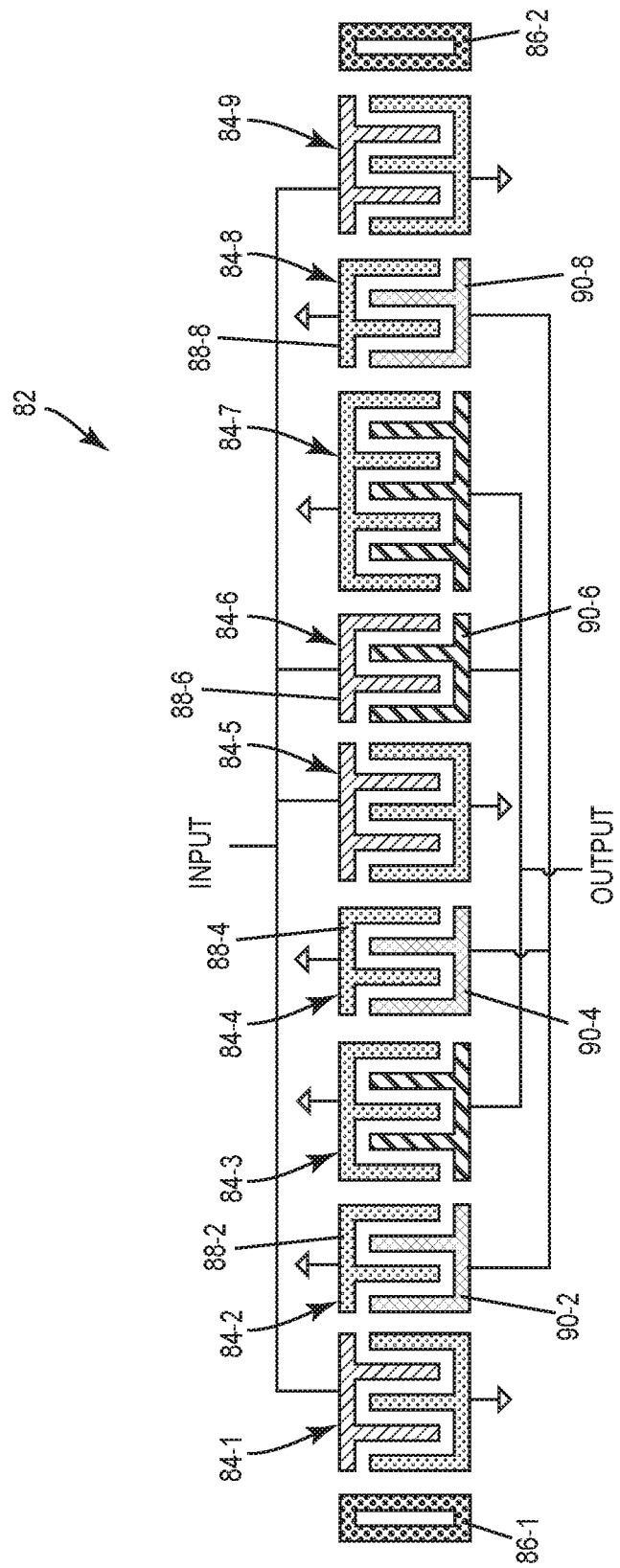
FIG. 10 illustrates a different SAW CRF structure that includes a plurality of IDTs that are longitudinally coupled between two reflective structures according to embodiments disclosed herein.

FIG. 10 illustrates a SAW CRF structure 82 that includes a plurality of IDTs 84-1 to 84-9 that are acoustically and longitudinally coupled between two reflective structures 86-1, 86-2. A substrate (e.g., 12 of FIG. 1) and a piezoelectric layer (e.g., 14 of FIG. 1) are not shown. The IDTs 84-1, 84-5, 84-9 are input IDTs and the IDTs 84-3, 84-7 are output IDTs as previously described. In FIG. 10, the IDTs 84-2, 84-4, 84-8 are additional IDTs that are not directly connected to the input signal or the output signal. In certain embodiments, each of the additional IDTs 84-2, 84-4, 84-6, 84-8 comprises an electrode pair that includes a corresponding first electrode 88-2, 88-4, 88-6, 88-8 and a corresponding second electrode 90-2, 90-4, 90-6, 90-8. Notably, the additional IDTs 84-2, 84-4, 84-6, 84-8 may include different types of IDTs. For example, the additional IDT 84-6 is electrically connected to the input signal and the output signal. In this regard, the additional IDT 84-6 comprises a first electrode 88-6 that is electrically connected to the input signal and a second electrode 90-6 that is electrically connected to the output signal. Accordingly, the additional IDT 84-6 is an IDT capacitor that alters the internal device capacitance as previously described. In further embodiments, the additional IDT 84-6 may comprise a floating electrode between the first electrode 88-6 and the second electrode 90-6 as previously described. In contrast to the additional IDT 84-6, the additional IDTs 84-2, 84-4, 84-8 are not directly electrically connected to either of the input signal and the output signal. The additional IDTs 84-2, 84-4, 84-8 instead comprise the corresponding first electrode 88-2, 88-4, 88-8 connected to ground and the corresponding second electrode 90-2, 90-4, 90-8 that is a floating electrode, or a floating voltage electrode. The additional IDTs 84-2, 84-4, 84-8 are positioned between corresponding ones of the input IDTs 84-1, 84-5, 84-9 and the output IDTs 84-3, 84-7, thereby reducing a capacitance between the input IDTs 84-1, 84-5, 84-9 and the output IDTs 84-3, 84-7 as previously described.

Those skilled in the art will recognize improvements and modifications to the preferred embodiments of the present disclosure. All such improvements and modifications are considered within the scope of the concepts disclosed herein and the claims that follow.

What is claimed is:

1. A surface acoustic wave (SAW) device, comprising:
   a piezoelectric material;
   at least one input interdigital transducer (IDT) on the piezoelectric material and electrically connected to an input signal and ground;
   at least one output IDT on the piezoelectric material and electrically connected to an output signal and ground; and
   an additional IDT on the piezoelectric material and electrically connected to the input signal and the output signal, wherein the additional IDT is arranged between the at least one input IDT and the at least one output IDT, and the additional IDT comprises interleaved electrode fingers.

2. The SAW device of claim 1, wherein the additional IDT comprises an IDT capacitor.

3. The SAW device of claim 1, wherein the additional IDT comprises a first electrode electrically connected to the input signal and a second electrode electrically connected to the output signal.

4. The SAW device of claim 1, further comprising a first reflective structure and a second reflective structure on the piezoelectric material, wherein the at least one input IDT, the at least one output IDT and the additional IDT are arranged between the first reflective structure and the second reflective structure.

5. The SAW device of claim 1, wherein the at least one input IDT comprises a plurality of input IDTs and the at least one output IDT comprises a plurality of output IDTs.

6. The SAW device of claim 5 wherein the plurality of input IDTs and the plurality of output IDTs are configured in an alternating arrangement.

7. The SAW device of claim 1, wherein at least one of the at least one input IDT, the at least one output IDT, and the additional IDT comprises an apodized IDT.

8. A surface acoustic wave (SAW) device, comprising:
   a piezoelectric material;
   a first reflective structure and a second reflective structure on the piezoelectric material;
   a plurality of input interdigital transducers (IDTs) and a plurality of output IDTs arranged on the piezoelectric material and between the first reflective structure and the second reflective structure, wherein the plurality of input IDTs and the plurality of output IDTs are configured in an alternating arrangement between the first reflective structure and the second reflective structure; and
   a plurality of additional IDTs arranged between corresponding ones of the plurality of input IDTs and corresponding ones of the plurality of output IDTs, wherein at least one additional IDT of the plurality of additional IDTs is electrically connected to an input signal and an output signal, and the at least one additional IDT of the plurality of additional IDTs comprises interleaved electrode fingers.

9. The SAW device of claim 8, wherein the plurality of additional IDTs comprises at least two additional IDTs electrically connected to the input signal and the output signal.

10. The SAW device of claim 8, wherein at least one of the plurality of input IDTs, the plurality of output IDTs, and the plurality of additional IDTs comprises a metallization ratio in a range of about 0.2 to about 0.8.

11. The SAW device of claim 8, wherein at least one of the plurality of input IDTs, the plurality of output IDTs, and the plurality of additional IDTs comprises an apodized IDT.

12. The SAW device of claim 8, wherein at least one other additional IDT of the plurality of additional IDTs is not directly electrically connected to either of the input signal and the output signal.

13. The SAW device of claim 12, wherein the at least one other additional IDT of the plurality of additional IDTs comprises a first electrode electrically connected to ground and a second electrode that is a floating electrode.

* * * * *